(12) United States Patent
Schuler et al.

(10) Patent No.: US 6,246,269 B1
(45) Date of Patent: Jun. 12, 2001

(54) PROGRAMMABLE DAMPING FOR WRITE CIRCUITS

(75) Inventors: John A. Schuler, Richfield; Craig M. Brannon, Maplewood, both of MN (US)

(73) Assignee: Agere Systems Guardian Corp., Miami Lakes, FL (US)

(*) Notice: Subject to any disclaimer, the term of this patent is extended or adjusted under 35 U.S.C. 154(b) by 0 days.

(21) Appl. No.: 09/283,154

(22) Filed: Apr. 1, 1999

Related U.S. Application Data

(60) Provisional application No. 60/080,798, filed on Apr. 6, 1998.

(51) Int. Cl.[7] ....................................... H03K 3/00
(52) U.S. Cl. .................. 327/110; 327/362; 327/478; 327/588; 360/46; 360/68
(58) Field of Search ..................... 327/588, 108, 327/110, 478, 530, 424, 423, 362; 360/68, 46

(56) References Cited

U.S. PATENT DOCUMENTS 5,469,095 * 11/1995 Peppiette et al. ............... 327/110
5,638,012 *  6/1997 Hashimoto et al. ............. 327/110

* cited by examiner

Primary Examiner—Dinh T. Le
(74) Attorney, Agent, or Firm—Kinney & Lange, P.A.

(57) ABSTRACT

A programmable current source is provided for an H-switch to dampen overshoot resulting from a drop in voltage at a node during data transitions. The programmable current source is connected to both nodes of the H-switch on each side of the write head and is responsive to a voltage drop to below a threshold voltage at one node to injecting current into the one node during the period that the node voltage is below the threshold voltage. Preferably, a second programmable current source is connected to both nodes and is responsive to a voltage rise to above a second threshold voltage at the one of the nodes to sink current from the node to dampen undershoot.

21 Claims, 5 Drawing Sheets

PROGRAMMABLE DAMPING FOR WRITE CIRCUITS

CROSS-REFERENCE TO RELATED APPLICATION(S)

This application claims priority of U.S. Provisional Application Ser. No. 60/080,798 filed on Apr. 6, 1998, for "Programmable Dampened Write Circuit" by John A. Schuler and Craig Brannon.

BACKGROUND OF THE INVENTION

The present invention relates to programmable current damping networks, and more particularly, to a programmable current damping network for damping overshoot and undershoot ringing effects in a write circuit of a magnetic disk drive.

Magnetic disk drives are employed to store large quantities of information in bits encoded on tracks of a disk as a series of logical ones and zeros. These logical ones and zeros are represented in bit cells, which are areas of near uniform size along the length of a track of the disk. It is desirable that the information bits be encoded on the disk as densely as practical, so that a maximum amount of information may be stored. This can be achieved by increasing bit cell density of the disk, namely by reducing the size of bit cells along a particular track or within a zone of tracks, thereby increasing the number of bit cells on the track. Increasing the number of bit cells per track increases the number of bit cells that can be encoded on each track, and therefore increases the amount of information stored.

Conventionally, logical ones are recorded as transitions in magnetic flux on a magnetic disk for the given bit cell; the absence of a transition indicates a logical zero. These transitions are created by switching the write current polarity through the write head. Transitions representing logical ones are preferably placed within each bit cell near the center of the bit cell, so that the data frequency (based on bit cell size and rotational speed of the disk) can be accurately locked by a phase locked loop during recovery of data from the disk, and to ensure that bits are not encoded over a bit cell boundary during write operations. As bit cells are more densely packed on a track, placement of transitions becomes even more important and difficult to precisely control. Thus, transition placement accuracy and bit cell density are two very important parameters in a write circuit for a disk drive.

Due to the inductive nature of a write circuit head and the parasitic capacitance associated with the write circuitry, overshoot and undershoot effects occur in the write current signal which delay the settling of write current to its final DC value. These overshoot and undershoot effects, sometimes called "ringing", adversely affect the transition placement and bit cell size concerns. One option when overshoot and undershoot effects are present is to simply wait for the write current to settle to its final DC value, and then enable the next transition for encoding a bit. This option means that bit cell duration must be increased to allow time for the write current to settle. While the accuracy of transition placement within bit cells in such a system would not be negatively affected by the ringing of the write current, the density of bit encoding by the write circuit is poor in comparison to desired goals. Another option when overshoot and undershoot affects the placement of the transition is to switch the write current before it has settled to its final value. This approach may meet acceptable encoding density, but results in decreased placement accuracy of the transitions and hinders subsequent recovery of data from the disk. More particularly, if the write current has not fully settled from a prior transition, switching for the next transition might commence in different or uncontrolled current levels, which results in sporadic placement of transitions in bit cells. Therefore, both options entail undesirable performance trade-offs where overshoot and undershoot occur.

One known solution to overshoot and undershoot problems is to connect a damping resistor across the terminals of the write head. The resistive damping technique reduces the settling time for the write current signal flowing through the head. However, resistive damping has several negative effects on the performance of the write circuit. Since some of the write current is diverted through the damping resistor, write current through the head is reduced. To achieve the desired value of write current through the head, more current must be generated to flow through both the head and the damping resistor. The damping resistor also slows the rise time for write current transitions. This can adversely affect the bit placement and cell density. While resistive damping reduces settling time, slower rise times may not be acceptable for high performance write circuits. Additionally, undershoot, which causes the loss of saturation of the head media, contributes to the problem of switching from uncontrolled current levels, and results in sporadic bit placement in the bit cells. Thus, there is need for a programmable damping network and disk drive write circuitry which overcomes the problems with undershoot while providing the user with a means to effectively control overshoot.

BRIEF SUMMARY OF THE INVENTION

A programmable current source is provided for a disk drive write driver circuit. The driver circuit comprises an H-switch having first and second nodes for connection to an inductive write head and first and second switches operable to direct write current from a current source in opposite directions through the write head when the H-switch is operating in respective first and second modes. The H-switch is operable such that a quiescent voltage at the first and second nodes is greater than a threshold voltage when the write current flows in a quiescent condition through the write head. The H-switch is operable to cause the voltage at one of the nodes to drop to below the threshold voltage upon a change between the first and second modes. The voltage drop at the one node causes a parasitic capacitance associated with the H-switch connected to that node to discharge. The programmable current source is connected to the first and second nodes and is responsive to a voltage drop to below the threshold voltage at the one node to inject current into the one node.

In one form of the invention, the programmable current source includes first and second resistors each connected to a respective first and second node. The first and second resistors exhibit equal electrical resistance. A voltage source provides a plurality of uniquely different voltage values. A third switch selectively connects the voltage source to the first and second resistors to supply one of the voltage values to the first and second resistors. Optionally, a first emitter-follower transistor has its emitter connected to the first resistor, and a second emitter-follower transistor has its emitter connected to the second resistor. The bases of the first and second emitter-follower transistors are connected to the third switch to receive the selected voltage value.

In another form of the invention, the programmable current source includes a plurality of resistance pairs each including a first resistor connected to the first node and a second resistor connected to the second node. The resistors of each resistance pair exhibits an resistance, and a switch associated with each resistance pair selectively connecting the voltage source to one of the resistance pairs to select a level of injected current to the node. The resistance of the different resistance pairs may be the same or different, and may be driven by the same or a different voltage value. The third switch is operated to select the resistance pairs, alone or in parallel, to select a level of current to be injected into the node.

According to another form of the invention, a second programmable current source is connected to the first and second nodes and is responsive to a voltage rise to above a second threshold voltage at the one of the first and second nodes to sink current from the one of the first and second nodes. The second threshold voltage has a value greater than that of the quiescent voltage. Preferably, the second programmable current source includes third and fourth resistors each connected to a respective first and second node. A second voltage source provides a plurality of different voltage values, at least one of which is the second threshold voltage. A fourth switch selectively connects the voltage source provides a plurality of different voltage values, at least one of which is the second threshold voltage. A fourth switch selectively connects the voltage source to the third and fourth resistors to supply one of the voltage values of the second voltage source to the third and fourth resistors. Also preferably, a third emitter-follower transistor has its emitter connected to the third resistor, and a fourth emitter-follower transistor has its emitter connected to the fourth resistor, with the bases of the third and fourth emitter-follower transistors being connected to the fourth switch to receive the selected voltage value.

According to another aspect of the invention, an H-switch write driver for a disk drive is compensated for overshoot in the write current by sensing when the voltage at one of the H-switch nodes connected to the inductive head drops to a level below a threshold level due to a change between the first and second modes of current direction between the nodes. Current is injected into the one node to re-charge discharged parasitic capacitance associated with the H-switch while the voltage at the node is below the threshold level.

Optionally, the H-switch write driver is also compensated for undershoot by sensing a voltage rise at one of the nodes to a level above a second threshold level which is greater than the quiescent voltage. Current is sunk from the node to at least partially discharge the charged parasitic capacitance while the voltage at the node is above the second threshold level.

DETAILED DESCRIPTION OF THE PREFERRED EMBODIMENTS

Figure 1:
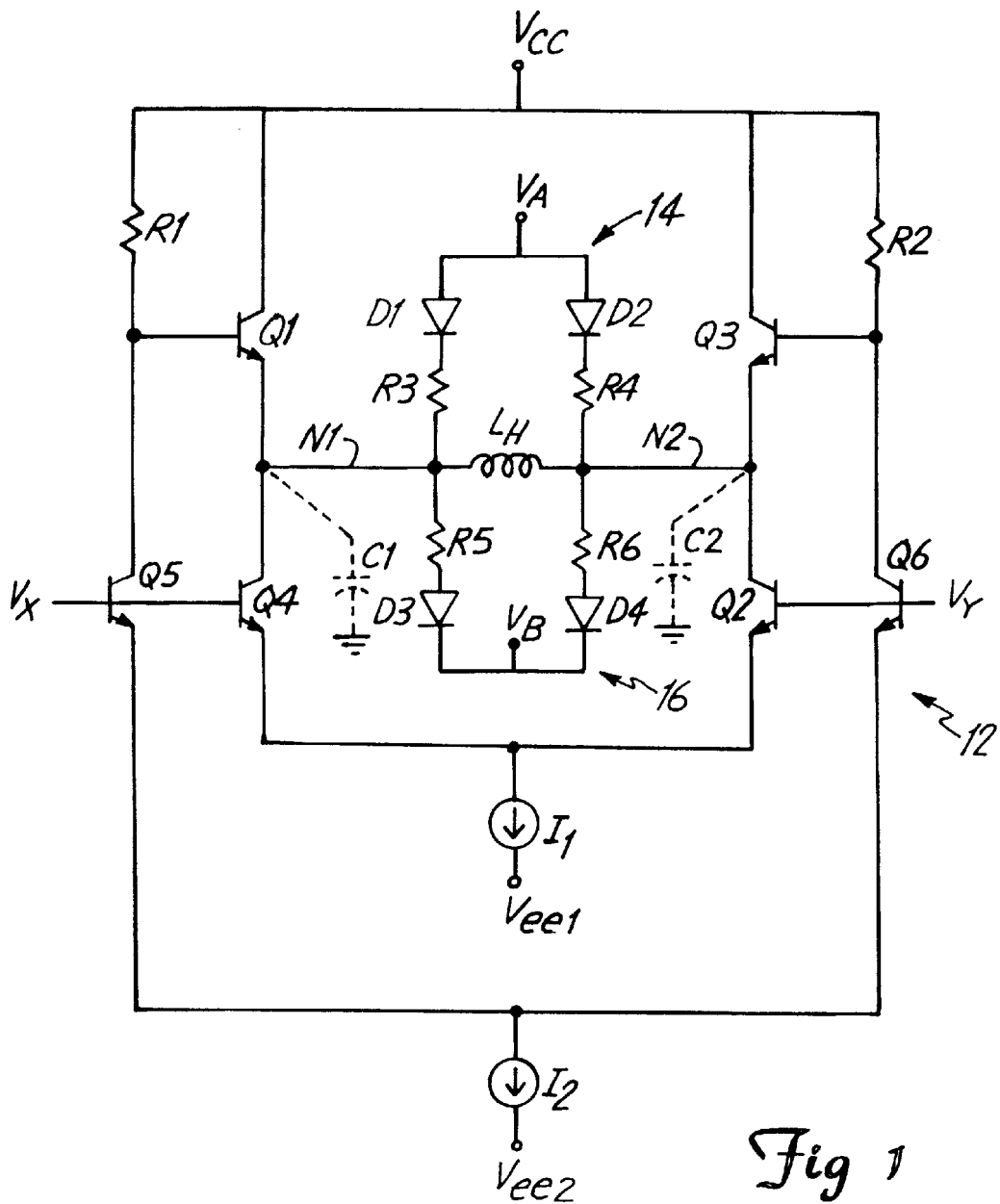
FIG. 1 is a schematic diagram illustrating the principles of the write circuit for a disk drive utilizing a suppression network of the present invention.

FIG. 1 is a circuit diagram of a simplified form of the present invention. An H-switch 12 comprises npn transistors $Q_1$, $Q_2$, $Q_3$ and $Q_4$ configured with nodes $N_1$ and $N_2$ for connection to the inductive coil of write head $L_H$. Data input signal $V_X$ is provided to the bases of transistors $Q_4$ and $Q_5$ and complementary data input signal $V_Y$ is provided to the bases of transistors $Q_2$ and $Q_6$. Transistors $Q_5$ and $Q_6$ provide inverted input signals to the bases of transistors $Q_1$ and $Q_3$, respectively. In operation of H-switch 12, a high $V_X$ will operate transistors $Q_4$ and $Q_5$ to conduction. Conduction of transistor $Q_5$ pulls down the base of transistor $Q_1$, thereby forcing transistor $Q_1$ into non-conduction. At the same time, the complementary signal $V_Y$ is low, forcing transistors $Q_2$ and $Q_6$ to non-conduction. With transistor $Q_6$ non-conducting, the voltage at the base of transistor $Q_3$ goes high, forcing transistor $Q_3$ into conduction. With transistors $Q_1$ and $Q_2$ non-conducting and transistors $Q_3$ and $Q_4$ conducting, a circuit path is completed from $V_{cc}$ through transistor $Q_3$, node $N_2$, head $L_H$, node $N_1$, transistor $Q_4$, the write current source $I_1$, to the negative supply $V_{ee1}$. Conversely, a high $V_Y$ and low $V_X$ operates the transistors oppositely causing current to flow in the opposite direction through head $L_H$ from node $N_1$ to node $N_2$.

FIG. 1 also illustrates overshoot suppression circuit 14 and undershoot suppression circuit 16 connected across head $L_H$ between nodes $N_1$ and $N_2$. Overshoot suppression circuit 14 comprises a first series connection of diode $D_1$ and resistor $R_3$ coupled between voltage source $V_A$ and node $N_1$, and a second series circuit of diode $D_2$ and resistor $R_4$ connected between voltage source $V_A$ and node $N_2$. Undershoot suppression circuit 16 comprises a first series circuit of resistor $R_5$ and diode $D_3$ connected between node $N_1$ and voltage source $V_B$ and a second series circuit comprising resistor $R_6$ and diode $D_4$ connected between node $N_2$ and source $V_B$. As will be more fully understood hereinafter, $V_A$ is a voltage source below $V_{cc}$, and $V_B$ is a voltage source above $V_{ee1}$; usually each of $V_A$ and $V_B$ has a value between $V_{cc}$ and $V_{ee1}$. While the invention will be described in connection with a positive voltage supply, $V_{cc}$, it is clear the circuit will operate with a negative voltage supply.

Ignoring, for the present, the effects of circuits 14 and 16 (assuming both are off) the operation of the basic H-switch can be explained. Assume initially that the circuit is in a quiescent condition with a steady state current flowing from node $N_1$ through head $L_H$ to node $N_2$. Under such conditions, the voltage at node $N_1$ is one diode drop below $V_{cc}$ ($V_{cc}-V_D$, where $V_D$ is one diode drop due to transistor $Q_1$). If head $L_H$ is a perfect inductor, having no inherent electrical resistance, there will be no voltage drop across the head, so the voltage at node $N_2$ will also be at $V_{cc}V_D$. However, the inherent resistance of head $L_H$ creates a small voltage drop $V_H$ across the head so that the voltage at node $N_2$ will be slightly below that at node $N_1$. Thus the voltage at node $N_2$ is $V_{cc}-V_D-V_H$, and the voltage at node $N_1$ is $V_{cc}-V_D$.

As shown in FIG. 1, parasitic capacitances $C_1$ and $C_2$ are associated with transistors $Q_2$ and $Q_4$ and extend between the respective nodes $N_1$ and $N_2$ and ground. During the steady state current flow through $L_H$ from node $N_1$ to node $N_2$, the parasitic capacitances C, and $C_2$ are fully charged to the voltage at the respective node, namely one diode drop below $V_{cc}$, and minus $V_H$ in the case of node $N_2$.

Figure 3A:
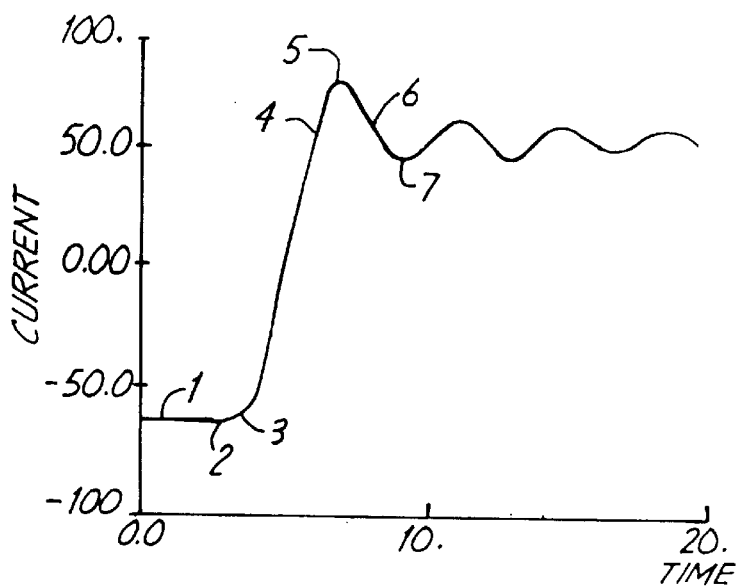
FIGS. 3A, 3B and 4A, 4B and 5A, 5B are current and voltage waveforms, respectfully, useful in explaining the principles of the present invention.
Figure 3B:
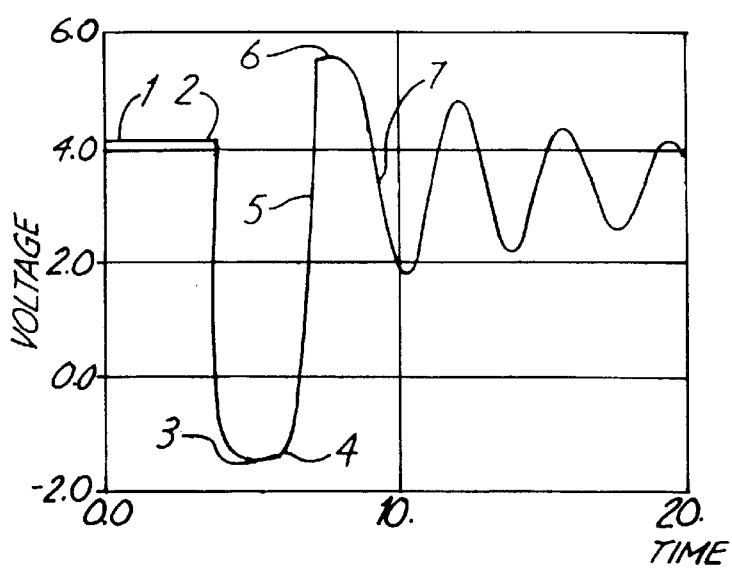

FIGS. 3A and 3B illustrate the current and voltage waveforms, respectively, at one of the nodes $N_1$ or $N_2$ during a mode change to reverse current direction through the head. More particularly, assuming transistors $Q_1$ and $Q_2$ are initially conducting and transistors $Q_3$ and $Q_4$ are non-conducting so that a steady state write current flows through the head from node $N_1$ to node $N_2$ (the circuit being in a quiescent state), FIGS. 3A and 3B illustrate the current and voltage waveforms at node $N_1$ when the state of conduction is reversed and the write current reverses direction through the head to flow from node $N_2$ to node $N_1$. Additionally, FIGS. 3A and 3B assume that suppression circuits 14 and 16 are not present or are off, and therefore examine the operation of the circuit without the inventive suppression circuits.

Point 1 on the voltage and current waveforms illustrates the steady state or quiescent condition with the current flowing from node $N_1$ to node $N_2$ through head $L_H$, as described. Thus, transistors $Q_1$ and $Q_2$ are in conduction and transistors $Q_3$ and $Q_4$ are in a state of non-conduction. At point 2, the transistors switch states of operation so that transistors $Q_3$ and $Q_4$ conduct and transistors $Q_1$ and $Q_2$ are non-conductive. Initially, however, current continues to flow in the direction from node $N_1$ to node $N_2$. However, due to the conductive state of transistor $Q_4$ the voltage at node $N_1$ drops dramatically to near $V_{ee1}$, as shown at point 3 of the voltage curve (FIG. 3B). The parasitic capacitance $C_1$ discharges. The voltage at node $N_1$ remains low as the current reverses in direction through $L_H$ until, at point 4 of the curves of FIGS. 3A and 3B, the voltage is low and the current is now approximately equal to the quiescent current in the opposite direction. However the current through head $L_H$ is diverted to two directions, one to re-charge parasitic capacitor $C_1$ and the other through the normal path of transistor $Q_4$ and the write current source $I_1$. As a result, the current supplied to node $N_2$ through transistor $Q_3$ increases to a level greater than $I_1$. This current increase is applied through head $L_H$ to node $N_1$ to charge parasitic capacitor $C_1$ and increase the voltage at node $N_1$ to the quiescent state (point 5 of the voltage waveform). However, because the current at point 5 exceeds $I_1$, the voltage continues to rise at node $N_1$ past the quiescent point 5 to point 6 on the curve of FIG. 3B.

When the voltage exceeds point 5, it exceeds the quiescent state of $V_{cc}-V_D-V_H$, meaning the current will begin to reverse in direction again and reduce in value. The current continues to reduce until it reaches the design write current $I_1$ (point 6). However, at point 6, the voltage at node $N_1$ exceeds the quiescent state, forcing further reduction of current though the head, as illustrated at point 7 of the current curve FIG. 3A. With the current less than $I_1$ at point 7, the current pulls the voltage down. It will be appreciated that the circuit goes into a "ringing" oscillation condition with the current leading the voltage until the inherent resistance of the head and transistors dampen the ringing and the voltage and current settle to the quiescent state described above.

Peaks at points 5 and 7 in FIG. 3A are known as current overshoot and current undershoot, respectively. Suppression circuits 14 and 16 illustrated in FIG. 1 serve to inject or sink current to or from one of the nodes to suppress current overshoot and undershoot. More particularly, circuits 14 and 16 inject or sink current to or from that node whose voltage drops significantly at the data transition. As a result, H-switch 12 more quickly settles to a quiescent state. In the example described above where the transition forces the voltage at node $N_1$ low, suppression circuits 14 and 16 inject or sink current to or from node $N_1$ at the transition.

Figure 4A:
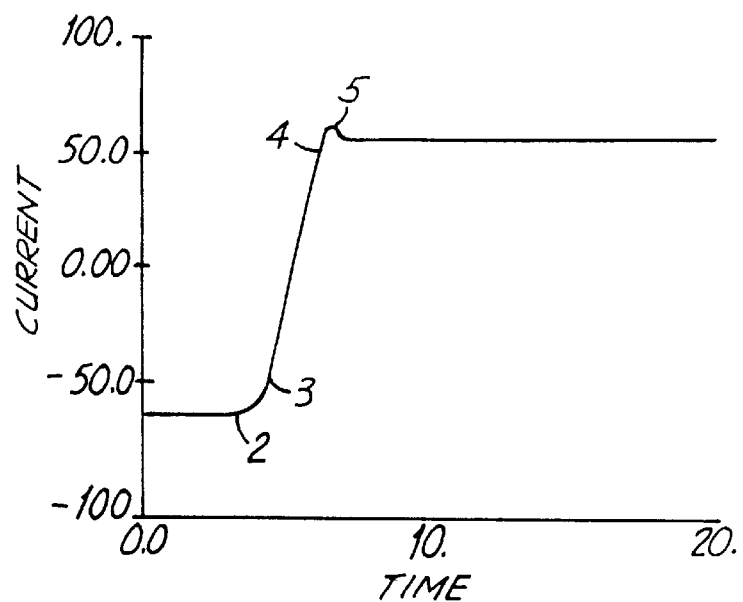
Figure 4B:
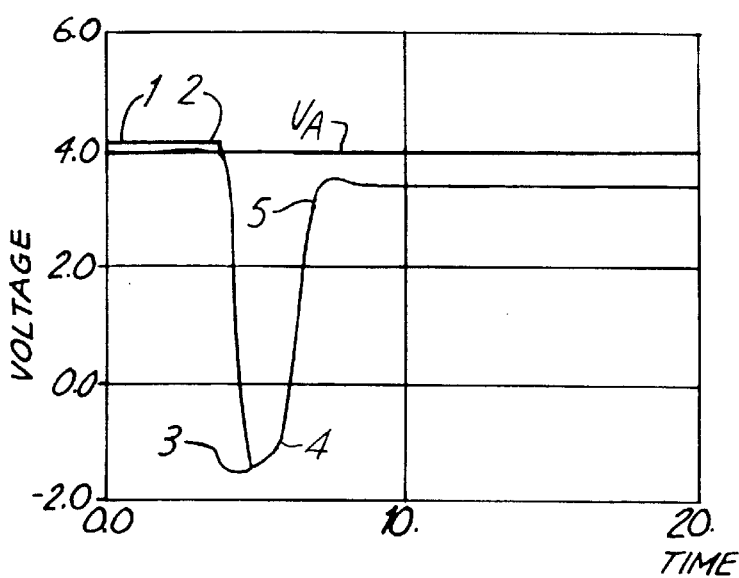

As described above, a voltage drop at node $N_1$ causes a current increase to re-charge parasitic capacitance $C_1$. Overshoot suppression circuit 14 supplies current to node $N_1$ when the voltage at node $N_1$ drops to below a threshold voltage established by threshold voltage source $V_A$ (FIG. 4B). Current flows from source $V_A$ through diode $D_1$ and resistor $R_1$ into node $N_1$ when the voltage at node $N_1$ drops to below a diode drop below $V_A$. Hence, the voltage value of source $V_A$ is less than a diode drop above the quiescent voltage at nodes $N_1$ and $N_2$. The current through resistor $R_1$ is added at node $N_1$ to the current from node $N_2$ to rapidly re-charge parasitic capacitor $C_1$ and more quickly stabilize the voltage at $N_1$ to the quiescent voltage. For example, if, without circuit 14, current source $I_1$ draws a 40 ma. current and parasitic capacitor C, draws a 30 ma. current to re-charge, node $N_2$ must supply a 70 ma. current to node $N_1$. When the voltage conditions are satisfied at node $N_1$ and parasitic capacitor $C_1$ is fully charged, the 70 ma. current causes a current spike, shown at point 5 in FIG. 3A, causing an overshoot condition and the first peak of ringing. However, if circuit 14 supplies a 20 ma. current when the voltage at node $N_1$ is below $V_A$, node $N_2$ need only supply a 50 ma. current to node $N_1$. Circuit 14 turns off when the voltage reaches $V_A$, leaving only the 50 ma. current from node $N_2$. As a result, the peak at point 5 is reduced, thereby reducing current overshoot. As a result, the current and voltage stabilize more rapidly to the quiescent voltage, as illustrated in FIGS. 4A and 4B.

While the voltage at node $N_1$ drops to near $V_{ee1}$, the voltage at node $N_2$ remains near the quiescent voltage of $V_{cc}$ minus $V_D$. $V_A$ is an established threshold voltage below $V_{cc}-V_D-V_H$. Thus, $V_A<V_{cc}-V_D-V_H$. When the voltage at node $N_2$ is at the quiescent voltage $V_{cc}-V_D$ or $V_{cc}-V_D-V_H$, which is greater than threshold voltage $V_A$, the reverse biasing of diode $D_2$ prevents current from being injected to node $N_2$ from threshold source $V_A$. However, upon the next data transition that would force the voltage at node $N_2$ low (below threshold voltage $V_A$), diode $D_2$ and resistor $R_4$ inject current into node $N_2$ while node $N_1$ remains stable.

It will be appreciated that the amount of current injected into the node is dependent upon the value of voltage $V_A$ and the value of the respective resistor $R_3$ or $R_4$. For this reason, $R_3$ and $R_4$ are equal in value, and the current injected into one or the other node equals $(V_A-V_D-V_N)/R_A$, where $R_A$ is the value of $R_3$ or $R_4$, $V_D$ is the diode drop due to diode $D_1$ or $D_2$, and $V_N$ is the voltage at the node.

Figure 5A:
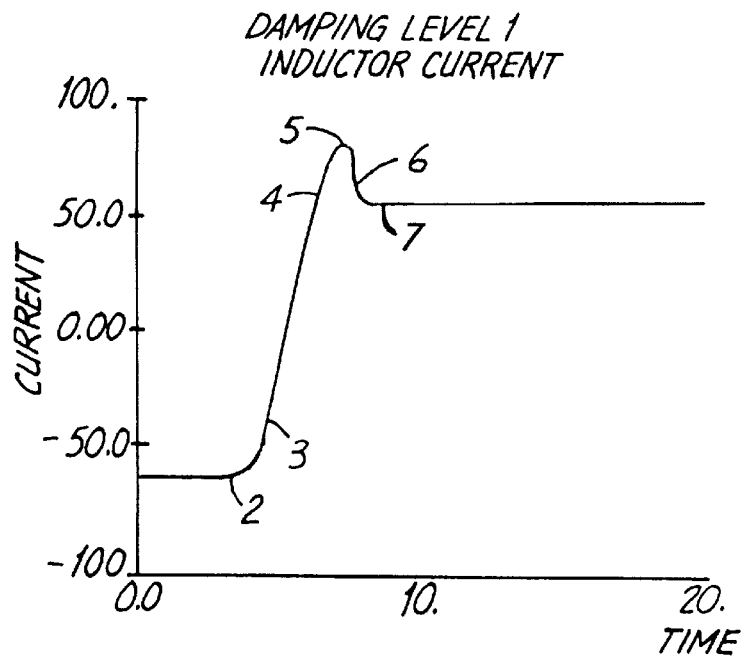
Figure 5B:
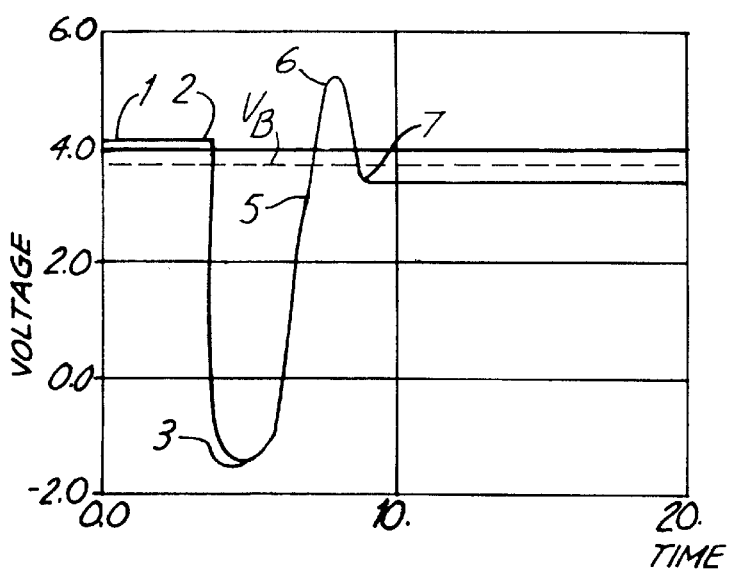

In a similar manner, suppression circuit 16 compensates for undershoot in the write current. More particularly, when the voltage at node $N_1$ exceeds a threshold voltage $V_B$, diode $D_3$ conducts causing current to sink through resistor $R_5$ to voltage source $V_B$. The value of $V_B$ plus the diode drop due to diode $D_3$ is greater than the quiescent state at the node $(V_{cc}-V_D)$ so that diodes $D_3$ and $D_4$ are reverse biased as to not sink current from the nodes during the quiescent state. Thus, $V_B>V_{cc}-2V_D$. See particularly FIG. 5B. The sinking of current from node $N_1$ pulls the excess current down more rapidly at point 6 causing the current waveform to settle more quickly to the quiescent state as illustrated in FIG. 5A. Because the voltage at node $N_2$ is relatively stable at $V_{cc}-V_D$, the voltage at node $N_2$ does not exceed $V_B-V_D$ and diode $D_4$ does not conduct. The amount of current sunk from the respective node through circuit 16 is based on the value of voltage $V_B$ and the value of resistor $R_5$ or $R_6$, as the case may be. For this reason, $R_5$ and $R_6$ are equal in value, and the current sunk from one or the other node equals $(V_N-V_B-V_D)/R_B$, where $R_B$ is the value of $R_5$ or $R_6$ and $V_N$ is the voltage at the node.

With reference to FIG. 4A, it will be appreciated that the current injected into the node to suppress overshoot $(V_A-V_D-V_N)/R_A$ will decrease as the voltage at the node increases from a low at point 4 of the curve of FIG. 4B and approaches the quiescent state at point 5. Moreover, the current sunk from the node to suppress undershoot $(V_N-V_B-V_D)/R_B$ will increase as the voltage at the node increases past the threshold voltage $V_B$ toward point 6, and will decrease as the voltage at the node decreases from point 6 to point 7 on the curve of FIG. 5B. Thus, on the current curve of FIG. 5A, the increasing sinking current decreases the write current at the node between points 5 and 6, reaching the quiescent state at point 7.

Figure 2:
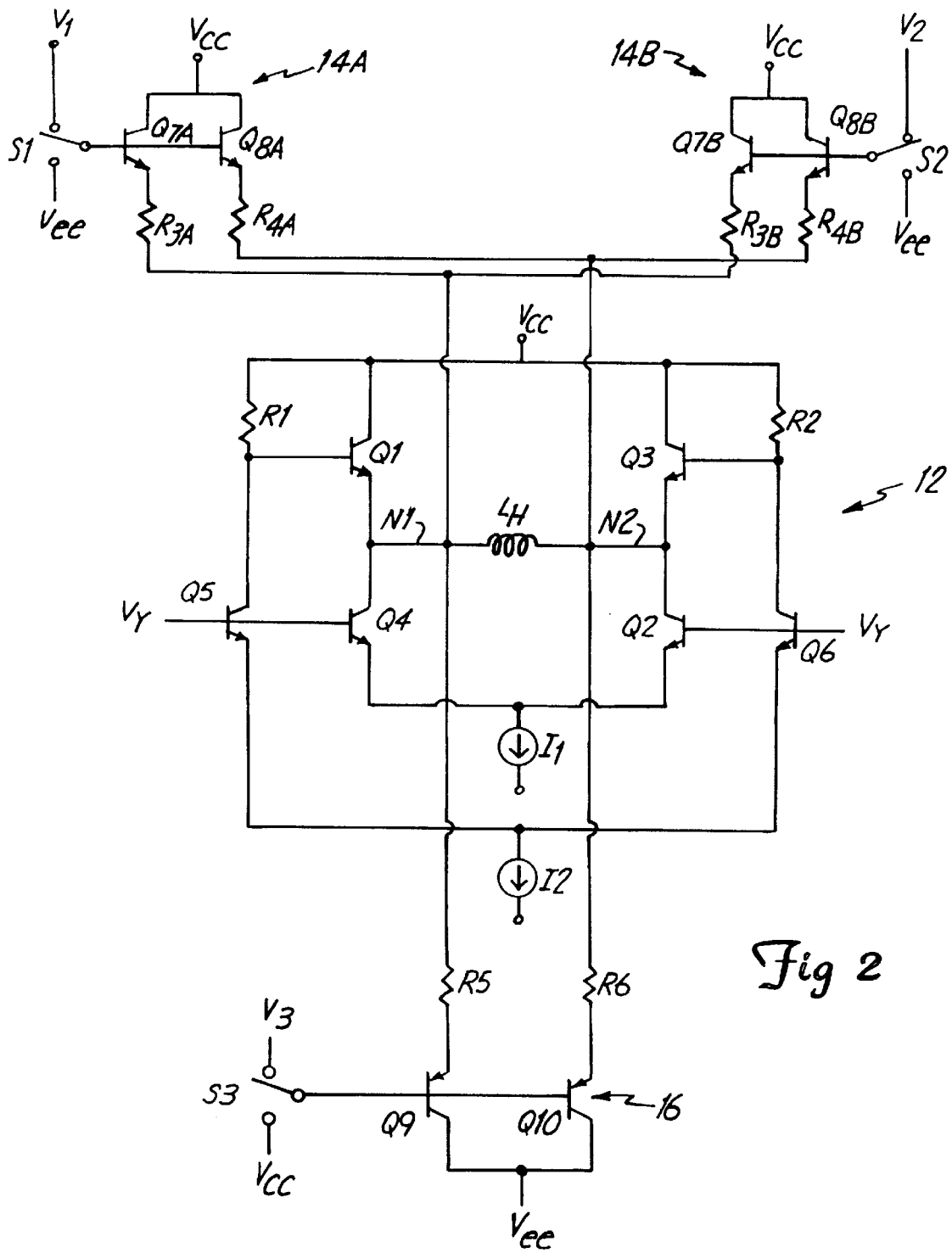
FIG. 2 is a schematic diagram of the write circuit for a disk drive illustrating a programmable suppression network of a preferred embodiment of the present invention.

FIG. 2 illustrates a programmable suppression circuit according to the presently preferred embodiment of the present invention. Overshoot suppression networks 14A and 14B are configured in parallel and each has an electronic two-connection switch $S_1$ or $S_2$ having one connection connected to a respective voltage source $V_1$ or $V_2$ and the other connection connected to voltage source $V_{ee}$. The common connection of switches $S_1$ and $S_2$ are connected to the bases of respective npn emitter follower transistors $Q_7$ and $Q_8$, whose collectors are connected to voltage source $V_{cc}$, and whose emitters are connected through respective resistors $R_3$ or $R_4$ to respective nodes $N_1$ and $N_2$. Overshoot suppression networks 14A and 14B are substantially similar, except that resistors $R_{3A}$ and $R_{4A}$ have different resistance values than resistors $R_{3B}$ and $R_{4B}$.

It will be appreciated that the threshold voltage at which current is injected into the respective node is dependent upon the voltage VI and $V_2$ as well as the value of resistors $R_3$ and $R_4$. For each overshoot suppression network, the values of resistors $R_3$ and $R_4$ are equal; that is, $R_{3A}$ equals $R_{4A}$ and $R_{3B}$ equals $R_{4B}$. Moreover, as explained above, the threshold voltage for the overshoot suppression network is based on the respective voltage $V_1$ or $V_2$. While it might be desirable in some cases to establish different threshold voltages for overshoot suppression, in which case $V_1$ will not equal $V_2$, in most cases it will be desirable to vary the injection current without varying the threshold voltage. Thus, most uses of the invention will employ $V_1=V_2$. Therefore, different injection currents are most desirably achieved by varying the resistors $R_3$ and $R_4$. The present invention achieves varying the resistance by setting the values of resistors $R_{3A}$ and $R_{4A}$ different from the values of resistors $R_{3B}$ and $R_{4B}$ and by selectively switching switches $S_1$ and $S_2$ to selectively activate circuits 14A and 14B to select either resistors $R_{3A}$ and $R_{4A}$ or resistors $R_{3B}$ and $R_{4B}$. Hence, with switch $S_1$ connected to $V_1$ and switch $S_2$ connected to $V_{ee}$, only resistors $R_{3A}$ and $R_{4A}$ are connected to the nodes, whereas with switch $S_2$ connected to $V_2$ and switch $S_1$ connected to $V_{ee}$, only resistors $R_{3B}$ and $R_{4B}$ are connected to the nodes. As a result, different current values may be injected to the nodes to control overshoot, thereby permitting a programmed control of the overshoot. It might be desirable to maximize the injected current by connecting both switches $S_1$ and $S_2$ to their respective voltages $V_1$ and $V_2$ to effectively connect resistors $R_{3A}$ and $R_{3B}$ in parallel and to effectively connect resistors $R_{4A}$ and $R_{4B}$ in parallel, thereby reducing the effective resistance. It might also be desirable to employ resistance values for each resistor pair that are equal, and control injection current by selectively connecting one or more suppression circuits 14A and 14B in parallel.

FIG. 2 also illustrates the preferred embodiment of a programmable undershoot suppression circuit according to the presently preferred embodiment of the present invention. Undershoot suppression network 16 has an electronic two-connection switch $S_3$ having one connection connected to voltage source $V_3$ and the other connection connected to voltage source $V_{cc}$. The common connection of switch $S_3$ is connected to the bases of respective pnp emitter follower transistors $Q_9$ and $Q_{10}$, whose collectors are connected to voltage source $V_{ee}$, and whose emitters are connected through respective resistors $R_5$ and $R_6$ to respective nodes $N_1$ and $N_2$.

With switch $S_3$ connected to voltage source $V_3$, which is greater than the quiescent voltage at the nodes, current from one of the nodes sinks through the respective resistor $R_5$ or $R_6$ to $V_{ee}$ when the voltage at the node exceeds $V_3+V_D$. With $R_5=R_6$, the amount of current sunk is $(V_N-V_3-V_D)R$, where $R=R_5=R_6$.

The present invention can operate either overshoot network 14A or 14B to effectively program write current overshoot, while eliminating undershoot using voltage damping network 16. Intermediate levels of overshoot may be obtained by connecting one or the other, or both, of electronic two position switches $S_1$ and $S_2$ to $V_1$ or $V_2$ to selectively program the overshoot suppression. By programming the level of overshoot, the transitions may be placed optimally closer together. This ultimately increases bit cell density, thus making write current overshoot a desirable quality.

Although the present invention has been described with reference to preferred embodiments, workers skilled in the art will recognize that changes may be made in form and detail without departing from the spirit and scope of the invention.

What is claimed is:

1. A write driver circuit for a disk drive comprising an H-switch having first and second nodes for connection to an inductive write head, first and second switches operable to direct write current from a current source in a first direction through the write head when the H-switch is operating in a first mode, and in a second direction, opposite the first direction, through the write head when the H-switch is operated in a second mode, the H-switch being operable such that a value of a first voltage at the first node and a value of a second voltage at the second node is greater than a first threshold voltage value when the write current flows in a quiescent condition through the write head, the H-switch being operable to cause one of the first and second voltages at one of the first and second nodes to drop to below the first threshold voltage value upon a change between the first and second modes of operation, the improvement comprising:

first programmable current source connected to the first and second nodes and responsive to a drop in the one of the first and second voltages at the one of the first and second nodes below the first threshold voltage value for injecting an overshoot compensation current into the one of the first and second nodes.

2. The write driver circuit of claim 1, wherein the drop in the one of the first and second voltages causes a parasitic capacitance associated with the switch connected to the one of the first and second nodes to discharge, the first programmable current source being operable to inject the overshoot compensation current into the one of the first and second nodes to re-charge the discharged parasitic capacitance.

3. The write driver circuit of claim 1, wherein the first programmable current source includes a first resistor connected to the first node and a second resistor connected to the second node, at least one voltage source providing a plurality of uniquely different voltage values, and a third switch selectively connecting the voltage source to the first and second resistors to supply one of the voltage values to the first and second resistors.

4. The write driver circuit of claim 3, including a first emitter-follower transistor having its emitter connected to the first resistor, and a second emitter-follower transistor having its emitter connected to the second resistor, the bases of the first and second emitter-follower transistors being connected to the third switch to receive the selected voltage value.

5. The write driver circuit of claim 4, wherein the first and second resistors have equal electrical resistance.

6. The write driver circuit of claim 3, wherein the first and second resistors have equal electrical resistance.

7. The write driver circuit of claim 1, wherein the first programmable current source includes a voltage source, a plurality of resistor pairs each including a first resistor connected to the first node and a second resistor connected to the second node, the first resistor of each resistor pair having the same electrical resistance as the second resistor of the respective resistor pair and the resistors of each resistor pair having a different electrical resistance from the resistors of each other resistor pair, and a third switch selectively connecting the voltage source to the first and second resistors of one of the resistor pairs.

8. The write driver circuit of claim 7, wherein each resistor pair includes a first emitter-follower transistor having its emitter connected to the first resistor and a second emitter-follower transistor having its emitter connected to the second resistor, the bases of the first and second emitter-follower transistors being connected to the third switch to receive the selected voltage value.

9. The write driver circuit of claim 1, including a second programmable current source connected to the first and second nodes and responsive to a voltage rise to above a second threshold voltage value at one of the first and second nodes for sinking an undershoot compensation current from the one of the first and second nodes, the second threshold voltage having a value greater than the value of the voltage at the first and second nodes when the write current flows in the quiescent condition through the write head.

10. The write driver circuit of claim 9, wherein the voltage rise at the one of the first and second nodes causes a parasitic capacitance associated with the switch connected to the one of the first and second nodes to charge to a value greater than a quiescent voltage at the quiescent condition, the second programmable current source being operable to sink the undershoot compensation current from the one of the first and second nodes to partially discharge the parasitic capacitance.

11. The write driver circuit of claim 9, wherein the second programmable current source includes a third resistor connected to the first node and a fourth resistor connected to the second node, at least one second voltage source providing a plurality of different voltage values, at least one of which is related to the second threshold voltage value, and a third switch selectively connecting the second voltage source to the third and fourth resistors to supply one of the voltage values of the second voltage source to the third and fourth resistors.

12. The write driver circuit of claim 11, including a third emitter-follower transistor having its emitter connected to the third resistor, and a fourth emitter-follower transistor having its emitter connected to the fourth resistor, the bases of the third and fourth emitter-follower transistors being connected to the third switch to receive the selected voltage value.

13. The write driver circuit of claim 12, wherein the third and fourth resistors have equal electrical resistance.

14. The write driver circuit of claim 11, wherein the third and fourth resistors have equal electrical resistance.

15. A write driver circuit for a disk drive comprising an H-switch having first and second nodes for connection to an inductive write head, first and second switches operable to direct write current from a current source in a first direction through the write head when the H-switch is operating in a first mode, and in a second direction, opposite the first direction, through the write head when the H-switch is operated in a second mode, the H-switch being operable such that a first voltage at the first node and a second voltage at the second node each have a value smaller than a threshold voltage value when the write current flows in a quiescent condition through the write head, the H-switch being operable to cause the value of one of the first and second voltages at one of the first and second nodes to rise to above the threshold voltage value upon a change between the first and second modes of operation, the improvement comprising:

a programmable current source connected to the first and second nodes and responsive to a rise in the one of the first and second voltages at the one of the one of the first and second nodes to above the threshold voltage value for sinking an undershoot compensation current from the one of the first and second nodes.

16. The write driver circuit of claim 15, wherein the rise in the one of the first and second voltages causes a parasitic capacitance associated with the switch connected to the one of the first and second nodes to charge to an value greater than the quiescent voltage, the programmable current source being operable to sink the undershoot compensation current from the one of the first and second nodes to at least partially discharge the parasitic capacitance.

17. The write driver circuit of claim 15, wherein the programmable current source includes a first resistor connected to the first node and a second resistor connected to the second node, at least one voltage source providing a plurality of different voltage values, at least one of which is related to the threshold voltage value, and a third switch selectively connecting the voltage source to the first and second resistors to supply one of the voltage values of the voltage source to the first and second resistors.

18. The write driver circuit of claim 17, including a first emitter-follower transistor having its emitter connected to the first resistor, and a second emitter-follower transistor having its emitter connected to the second resistor, the bases of the first and second emitter-follower transistors being connected to the third switch to receive the selected voltage value.

19. The write driver circuit of claim 18, wherein the first and second resistors have equal electrical resistance.

20. A process of compensating for write current overshoot in a write driver circuit for a disk drive comprising an H-switch having first and second nodes for connection to an inductive write head, first and second switches operable to direct write current from a current source in a first direction through the write head when the H-switch is operating in a first mode, and in a second direction, opposite the first direction, through the write head when the H-switch is operated in a second mode, the H-switch being operable such that a value of a first voltage at the first node and a value of a second voltage at the second node is greater than a first threshold voltage value when the write current flows in a quiescent condition through the write head, the H-switch being operable to cause one of the first and second voltages at one of the first and second nodes to drop to below the threshold voltage value upon a change between the first and second modes of operation, thereby causing a parasitic capacitance associated with the switch connected to the one of the first and second nodes to discharge, the process of compensating the write driver circuit for overshoot of the write current comprising:

sensing a drop in one of the first and second voltages at one of the first and second nodes to a level below the level of the first threshold voltage due to a change between the first and second modes of operation of the H-switch, and injecting a programmable overshoot compensation current into the one of the first and second nodes to re-charge the discharged parasitic capacitance.

21. The process of claim 20 wherein the H-switch is operable to cause one of the first and second voltages at one of the first and second nodes to rise to above the threshold voltage value upon a change between the first and second modes of operation, thereby causing the parasitic capacitance associated with the switch connected to the one of the first and second nodes to charge, the process including compensating the write current driver circuit for undershoot of the write current by sensing a rise in one of the first and second voltages at one of the first and second nodes above a second threshold voltage, the second threshold voltage having a value greater than the value of the voltage at the first and second nodes when the write current flows in a quiescent condition through the write head, and sinking an undershoot compensation current from the one of the first and second nodes to at least partially discharge the charged parasitic capacitance.

* * * * *